United States Patent
Duan et al.

(10) Patent No.: US 9,331,051 B2
(45) Date of Patent: May 3, 2016

(54) WAFER SCALE TECHNIQUE FOR INTERCONNECTING VERTICALLY STACKED DIES

(71) Applicant: Technische Universiteit Eindhoven, Eindhoven (NL)

(72) Inventors: Pinxiang Duan, Eindhoven (NL); Elbertus Smalbrugge, Eindhoven (NL); Oded Raz, Eindhoven (NL); Harmen Joseph Sebastiaan Dorren, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 14/354,647

(22) PCT Filed: Nov. 1, 2012

(86) PCT No.: PCT/EP2012/071653
§ 371 (c)(1),
(2) Date: Apr. 28, 2014

(87) PCT Pub. No.: WO2013/064592
PCT Pub. Date: May 10, 2013

(65) Prior Publication Data
US 2014/0300008 A1    Oct. 9, 2014

Related U.S. Application Data

(60) Provisional application No. 61/628,734, filed on Nov. 4, 2011.

(51) Int. Cl.
*H01L 21/00*    (2006.01)
*H01L 23/00*    (2006.01)
(Continued)

(52) U.S. Cl.
CPC ............... *H01L 24/85* (2013.01); *H01L 24/24* (2013.01); *H01L 24/27* (2013.01); *H01L 24/49* (2013.01);
(Continued)

(58) Field of Classification Search
CPC ............ H01L 21/8221; H01L 23/4012; H01L 25/043; H01L 25/0756; H01L 25/117; H01L 2225/06513; H01L 21/563; H01L 2021/60022; H01L 21/0273; H01L 21/2254; H01L 21/312; H01L 21/47; H01L 2224/01; H01L 2224/02; H01L 2224/02163; H01L 2224/031
See application file for complete search history.

(56) References Cited

U.S. PATENT DOCUMENTS

2003/0071335 A1    4/2003    Jeung et al.

FOREIGN PATENT DOCUMENTS

| JP | 2006165286 | 6/2006 |
| JP | 2009076530 | 4/2009 |
| JP | 2009140949 | 6/2009 |

*Primary Examiner* — David Vu
*Assistant Examiner* — Cuong Nguyen
(74) *Attorney, Agent, or Firm* — Lumen Patent Firm

(57) ABSTRACT

A method and device for interconnecting stacked die surfaces with electrically conductive traces is provided that includes bonding, using a first layer of a photoresist compound, a second die (2) on top of a first die (1), heating the first layer above a pyrolyzation point of the photoresist compound, where the photoresist compound transitions to a stable layer, depositing a second layer of the photoresist compound (PR), using lithography, from a top surface of the first die (1) to a top surface of the second die (2), heating the second photoresist compound layer to a liquid state, where the liquid photoresist compound forms a smooth convex bridge between the first die (1) top surface and the second die (2) top surface, and depositing an electrically conductive layer on the smooth convex bridge, where an electrically conductive trace is formed between the first die (1) top surface and the second die (2) top surface.

18 Claims, 12 Drawing Sheets

(51) Int. Cl.
*H01L 25/065* (2006.01)
*H01L 25/00* (2006.01)

(52) U.S. Cl.
CPC ............... *H01L 24/66* (2013.01); *H01L 24/82* (2013.01); *H01L 24/94* (2013.01); *H01L 25/0657* (2013.01); *H01L 25/50* (2013.01); H01L 2223/6627 (2013.01); H01L 2224/05599 (2013.01); H01L 2224/24011 (2013.01); H01L 2224/24051 (2013.01); H01L 2224/24146 (2013.01); H01L 2224/24226 (2013.01); H01L 2224/24998 (2013.01); H01L 2224/27416 (2013.01); H01L 2224/27418 (2013.01); H01L 2224/27618 (2013.01); H01L 2224/291 (2013.01); H01L 2224/2919 (2013.01); H01L 2224/32145 (2013.01); H01L 2224/451 (2013.01); H01L 2224/45015 (2013.01); H01L 2224/48091 (2013.01); H01L 2224/49174 (2013.01); H01L 2224/49175 (2013.01); H01L 2224/49431 (2013.01); H01L 2224/82007 (2013.01); H01L 2224/82101 (2013.01); H01L 2224/83192 (2013.01); H01L 2224/83855 (2013.01); H01L 2224/85007 (2013.01); H01L 2224/85399 (2013.01); H01L 2224/94 (2013.01); H01L 2225/06524 (2013.01); H01L 2225/06568 (2013.01); H01L 2924/01029 (2013.01); H01L 2924/10253 (2013.01); H01L 2924/10271 (2013.01); H01L 2924/10329 (2013.01); H01L 2924/10335 (2013.01); H01L 2924/3011 (2013.01); H01L 2924/30107 (2013.01); H01L 2924/30111 (2013.01)

(d)

(e)

(f)

(g)

WAFER SCALE TECHNIQUE FOR INTERCONNECTING VERTICALLY STACKED DIES

CROSS-REFERENCE TO RELATED APPLICATIONS

This application is a 371 of PCT/EP2012/071653 filed on Nov. 1, 2012. PCT/EP2012/071653 filed on Nov. 1, 2012 claims the benefit of U.S. Provisional application 61/628,734 filed on Nov. 4, 2011.

FIELD OF THE INVENTION

The present invention relates generally to integrated circuit processing. More particularly, the invention relates to three-dimensional circuit integration by connecting surfaces of different heights.

BACKGROUND OF THE INVENTION

While the integration of more transistors on a single piece of silicon has continued almost undisturbed for the past 40 years, recent generations of processors are beginning to suffer from a growing shortage of bandwidth for CPU to memory bandwidth. One attempted solution is in the form of 3D stacking of multiple silicon dies in an effort to offer some relief in terms of co-integration of memory and processing capabilities. For implementation in silicon, thinner dies and through silicon vias (TSVs) have been developed as an interconnect solution between different stacked dies. While stacked chip may indeed solve some of the bandwidth issue, it raises concerns about heat dissipation and thermal management. Recently the use of micro-fluidics channel, etched through the bottom of the stacked dies, to pump chilled water through capillaries between the sandwiched silicon layers has been demonstrated as a solution to the heat dissipation problem, but this requires thicker dies and makes the use of Through Silicon Via's (TSV) for interconnecting the layers complicated. Interconnect density is becoming a serious problem in high end processors. Three-dimensional (3D) device stacking is a promising approach to increase density and scalability.

Turning now to application in the field of interconnects and co-integration of electronics and photonics, a critical issue affecting the performance of state of the art silicon processors is the limited interconnect density. A possible solution to this problem may be found in the form of optical interconnect channels. Compared with metal wires, optical interconnect links exhibit inherent advantages for transferring signals from one place to another. Owing to photons lack of electrical charge, transmission loss is small and independent of data rate. Optics can certainly avoid density limitations encountered in electrical systems, if the whole top surface of the chip can be used for placing vertically emitting lasers and photo detectors for data communication, as the area scales quadratically with the chip's size allowing for an estimated 50 Tb/s for a chip measuring 310 mm². The question is how to integrate the opto-electrical components with the electronic driving circuits in the most advantageous way.

Closely stacking opto-electrical dies onto the top surface of a CMOS chip can maximize high speed interconnect performance and reduce the device footprint. Among all the stacking technologies, TSV is the most efficient 3D stacking approach, but it can only be used for thin silicon die stacks. 850 nm opto-electrical dies widely used in the optical interconnect are based on GaAs, neither GaAs substrate nor silicon CMOS substrate are transparent at 850 nm. An optical transceiver with physically drilled holes through CMOS for light path after flip chip attachment has been developed. However, to realize holes in this special CMOS IC, approximately 20 RIE steps were required to etch through the film stack to expose the silicon wafer. Another demonstration is using wire bonding to connect opto-electrical device and CMOS. The opto-electrical die was thinned down to 25 µm before integration, which makes the opto-electrical device very fragile. In addition wire bonds introduce stray inductances which limit eventual bandwidth of interconnects.

What is needed is a process that integrates the opto-electrical components with the electronic driving circuits in the most advantageous way that allows for 3D stacking of multiple dies on top of each other regardless of their composition in a cost effective and wafer scalable method.

SUMMARY OF THE INVENTION

To address the needs in the art, a method of interconnecting stacked die surfaces with electrically conductive traces is provided that includes bonding, using a first layer of a photoresist compound, spun on top of the bottom die and placing a second die on top of the first die. The photoresist acts as the bonding agent and can be controlled for thickness by controlling the photoresist deposition speed and amounts. The assembled device can then be exposed to UV light, which will cause all the resist on top of the bottom die, which is not covered by the second die, to be removed in the development stage. Heating the remaining photoresist sitting between the dies above a pyrolyzation point of the photoresist compound, will cause the photoreisst compound to transitions to a stable layer. Sufficient photoresist is then deposited on the stacked dies to allow for coverage of bottom and top dies. This layer of photoresist is then exposed to UV light with an appropriate mask and developed to leave areas of photoresist overlapping the pads to be connected on top and bottom surfaces. Heating the photoresist compound areas causes the photoresist to return to its liquid state, which in turn results in the forming of a smooth convex bridge between the first die top surface and the second die top surface. Finally a seeding layer is deposited on top of the whole sub assembly, and a photoresist layer is used to define areas for electro-plating the required electrically conductive traces on the smooth convex bridge, forming the interconnect layer between the first die top surface and the second die top surface.

According to one aspect of the invention, the steps of forming electrically conductive traces between the first die top surface and the second die top surface are iteratively repeated.

In another aspect of the invention, the method further includes depositing a second electrically conductive layer on top of the first electrically conductive layer, where a co-axial transmission trace is formed, where signal crosstalk and signal integrity are improved.

In a further aspect of the invention, the photoresist compound is applied to the top surface of the first die using a photoresist spinning process or a spraying process. In one aspect, a thickness of the first layer of the photoresist compound is controlled using a spinning speed or an acceleration of the spinning process.

In yet another aspect of the invention, the second die is placed on the first die using a pick and place machine.

According to one aspect of the invention, the first layer of the photoresist compound has a thickness in a range of 2-30 microns.

In another aspect of the invention, the bonding layer between the first die top surface and the second die bottom surface is flood exposed with UV light where the second die is a light blocking layer for the first layer of the photoresist compound.

In a further aspect of the invention, the photoresist bonding layer between the first die top surface and second die bottom surface is heated above a pyrolyzation temperature of the photoresist compound for hardening.

According to another aspect of the invention, the conductive trace and the photoresist bridge span a height up to 250 microns.

In yet another aspect of the invention, the electrically conductive layer is deposited using deposition processes that include sputtering, evaporation, electrical plating or electroless plating.

In a further aspect of the invention, the electrically conductive layer can be a material such as gold, silver, platinum, titanium, aluminum or copper.

According to another aspect of the invention, a thickness of the electrically conductive layer is determined according to the duration of the deposition.

In a further aspect of the invention, a width of the electrically conductive layer is determined according to a mask design.

According to one aspect of the invention, an impedance match between the first die and the second die is determined according to principles of metallic strip-line traces.

In another aspect of the invention, the photoresit layer deposition can include exposure of multiple the photoresist layers, exposure time, photoresist compound amount, pre baking or post baking.

According to another aspect of the invention, the first die or the second die can be an electro-optical die, CMOS, Bi-CMOS, SiGe, GaAs, InP or Silicon on Insulator.

According to one embodiment of the invention, a stacked die interconnection is provided that includes a first die, a bonding layer deposited on the first die, a second die stacked on the bonding layer on the first die, a non-conductive bridging compound deposited from a top of the first die to a top of the second die, and conductive traces deposited on the bridging compound, where the conductive traces electrically connects the first die to the second die.

In one aspect of the stacked die interconnection, the bonding layer is a photoresist compound.

In another aspect of the stacked die interconnection, the non-conductive bridging compound is a photoresist compound.

In a further aspect of the stacked die interconnection, the bonding layer has a thickness in a range of 2-30 microns.

According to another aspect of the stacked die interconnection, the conductive traces and the bridging compound span a height of up to 250 microns.

In yet another aspect of the stacked die interconnection, the conductive trace is a material that can include gold, silver, platinum, titanium, aluminum or copper.

In a further aspect of the stacked die interconnection, the first die or the second die can be an electro-optical die, CMOS, Bi-CMOS, SiGe, GaAs, InP or Silicon on Insulator.

DETAILED DESCRIPTION

Figure 1:
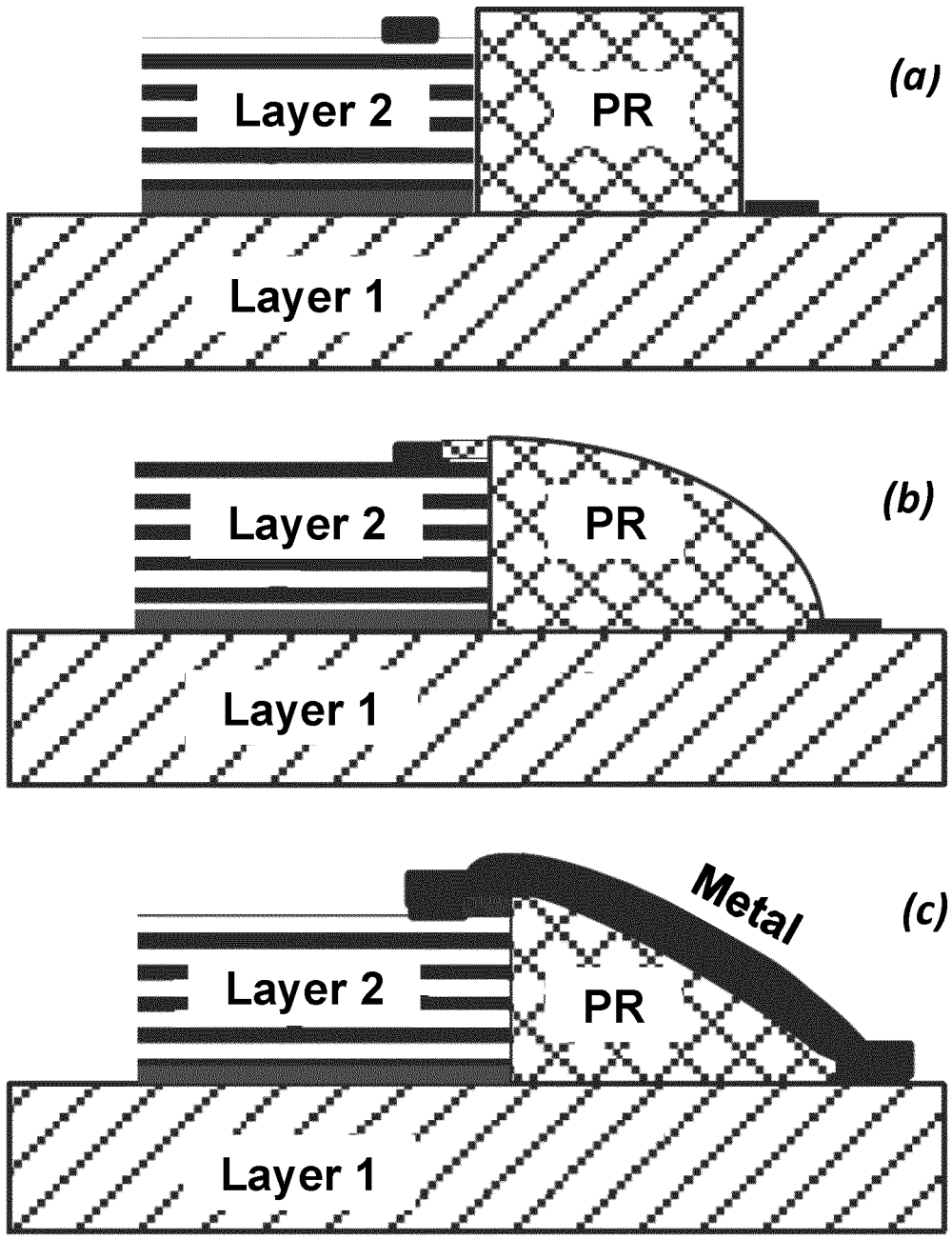
FIGS. 1a-1g show the interconnecting stacked die and how it is achieved with lithographic precision and on a wafer scale, according to one embodiment of the invention.
Figure 1:
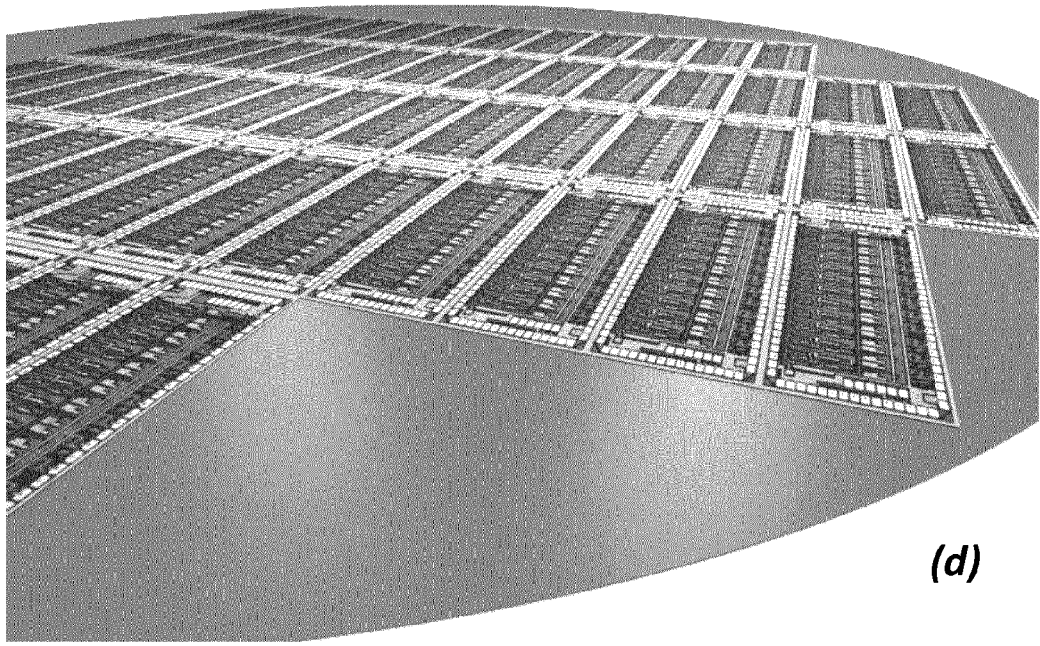
Figure 1:
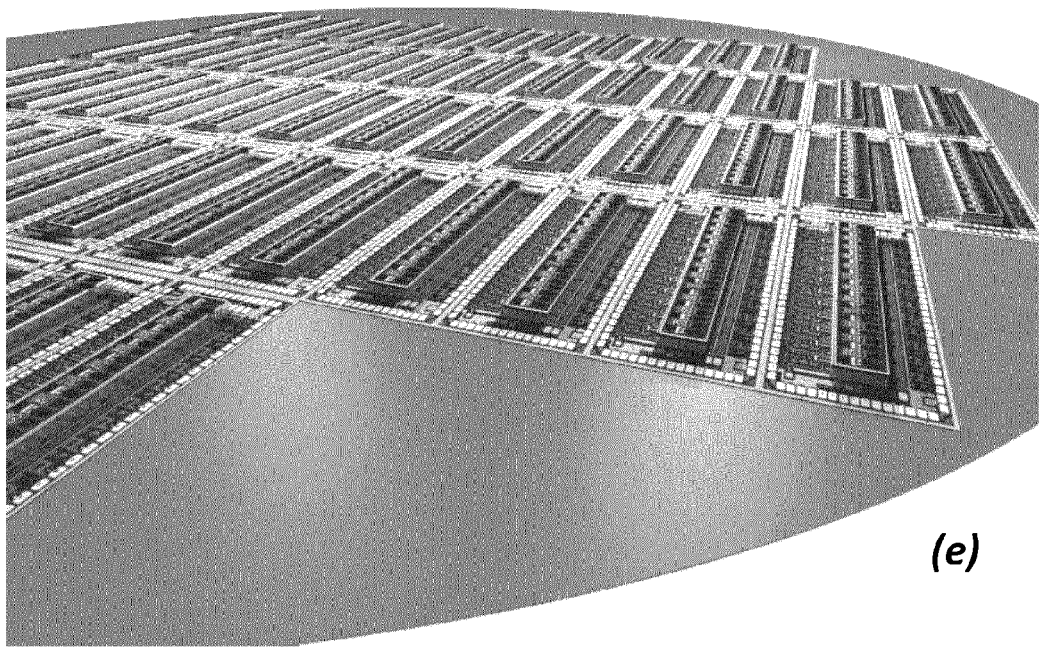
Figure 1:
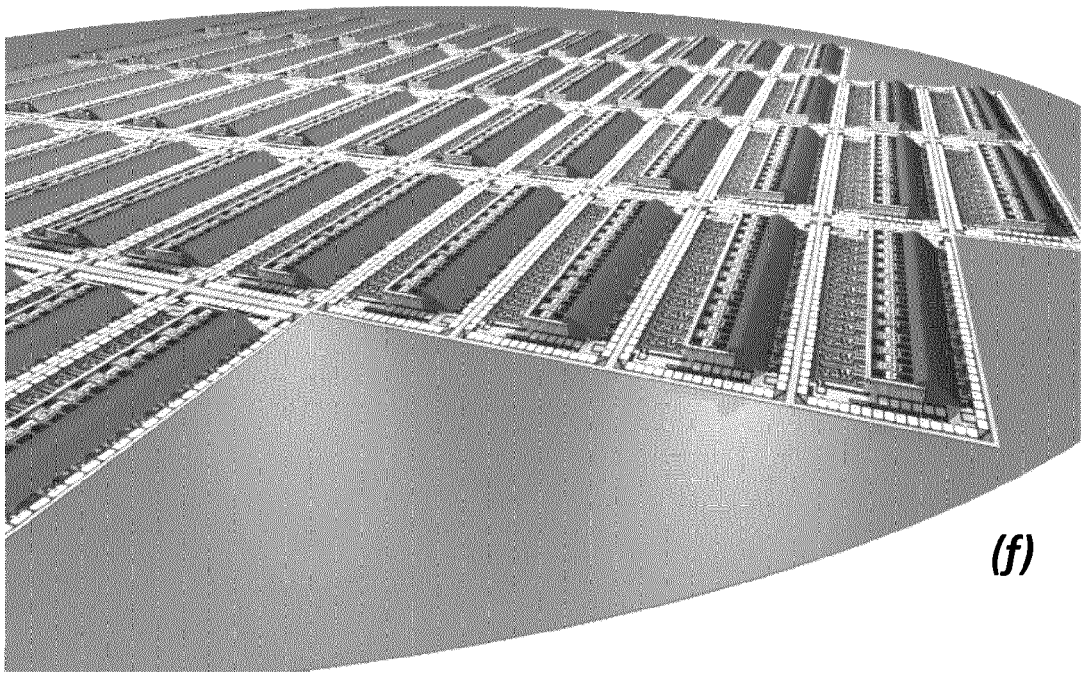
Figure 1:
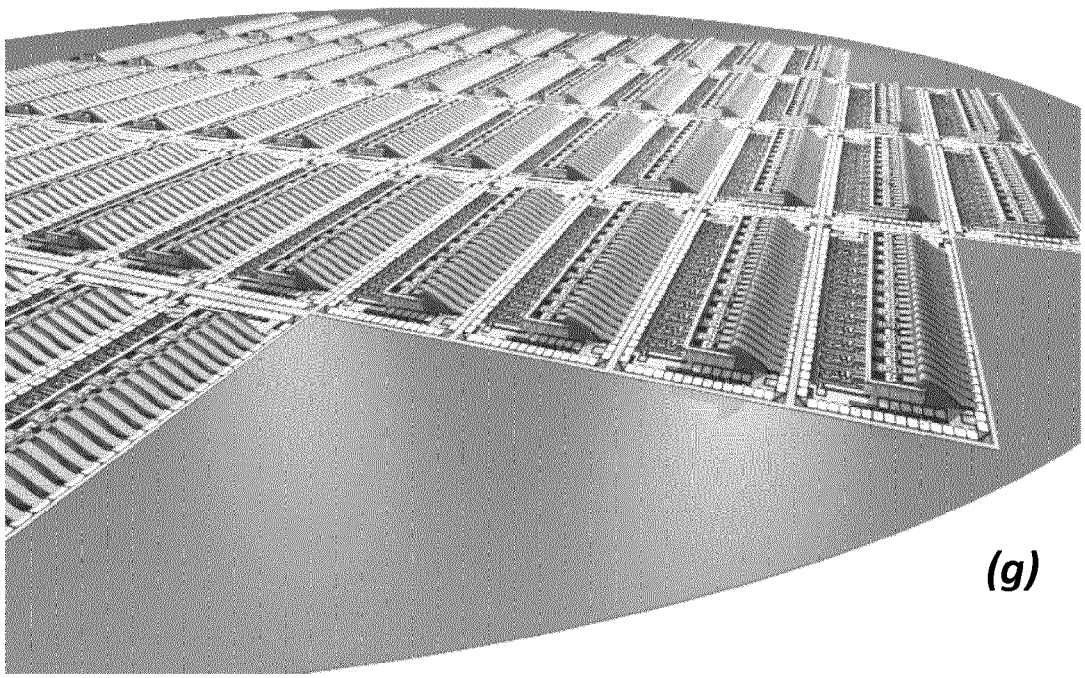

The invention solves the problem of multiple layer interconnect by using a wafer scale method for making metal bridges between layers separated by heights as large as 250 microns. In one embodiment, a low-resolution lithographic process is used that includes steps, which require no specialized machinery or materials.

The current invention provides a method of bridging big steps between two stacked chips when TSV is not applicable and where too many wire bonds are needed. According to one embodiment, an ultra-thick photoresist (PR) layer is used to realize a smooth slope between two different height surfaces (such as 220 µm). Key processes parameters of the current invention include multilayer spinning of PR, PR reflow and metallization over the re-shaped PR bridge by electrical-plating for electrical connection. Compared with wire bonding, the current invention is fabricated on wafer scale and smaller inductance is introduced.

In one embodiment, the method of interconnecting stacked die surfaces with electrically conductive traces includes bonding, using a first layer of a PR compound, spun on top of the bottom die and placing a second die on top of the first die. The PR acts as the bonding agent and can be controlled for thickness by controlling the PR deposition speed and amounts. The assembled device can then be exposed to UV light which will cause all the PR on top of the bottom die, which is not covered by the second die, to be removed in the development stage. Heating the remaining PR sitting between the dies above a pyrolyzation point of the PR compound, will cause the PR compound to transition to a stable layer. Sufficient PR is then deposited on the stacked dies to allow for coverage of bottom and top dies. This layer of PR is then exposed to UV light with an appropriate mask and developed to leave areas of PR overlapping the pads to be connected on top and bottom surfaces. Heating the PR compound areas causes the PR to return to its liquid state, which in turn results in the forming of a smooth convex bridge between the first die top surface and the second die top surface. Finally a seeding layer is deposited on top of the whole sub assembly, and a PR is used to define areas for electro-plating the required electrically conductive layer on the smooth convex bridge, forming the interconnect layer between the first die top surface and the second die top surface.

According to one aspect of the invention, the steps of forming an electrically conductive trace between the first die top surface and the second die top surface can be iteratively repeated. The electrically conductive layer can be deposited using deposition processes that include sputtering, evaporation, electrical plating or electro-less plating. Further, the electrically conductive layer can be a material such as gold, silver, platinum, titanium, aluminum or copper. The thickness of the electrically conductive layer is determined according to the duration of the deposition, and the width of the electrically conductive layer is determined according to a mask design.

FIGS. 1a-1g show one embodiment of the invention, where interconnecting stacked dies is achieved with lithographic precision and on a wafer scale. By using a relatively thick PR compound, which can be lithographically defined and processed (FIG. 1a) and then heating it up so that it gains back some of its fluid nature, where a smooth convex bridge is formed between the bottom and top dies (FIG. 1b), which can be readily covered with evaporated or sputtered gold and further plated using electro-plating to make the required electrical connects (FIG. 1c). The process includes one or two steps of coating the stacked chips with the PR material and a couple of lithographic steps followed by reflow and plating. Computer renderings of the process and device are shown in FIGS. 1d-1g.

In a further aspect of the invention, the PR bridge between the first die top surface and second die top surface is heated above a pyrolyzation temperature (typically between 140-160 deg C.) of the PR compound for hardening. The PR layer deposition process can include exposure of multiple PR layers, varying exposure time, different PR compound amounts, pre baking or post baking temperature cycles.

Figure 2:
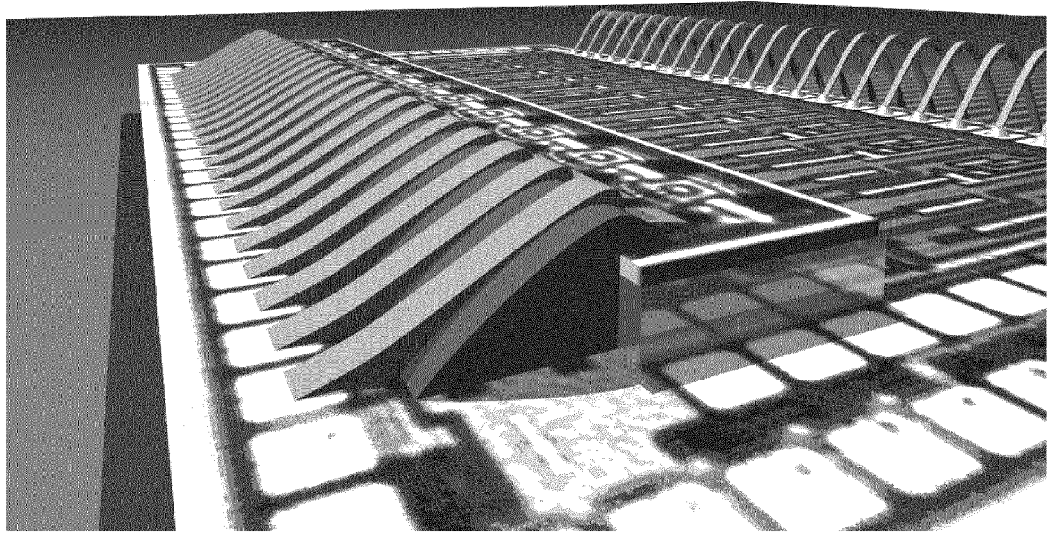
FIG. 2 shows a computer drawing of the resulting stacked chips, according to one embodiment of the invention.

Once fabrication is complete the two layers are electrically connected without the need to use TSV or wire bonds. FIG. 2 shows a computer drawing showing the resulting stacked chips. The same process can be extended to bridge multiple layers as well.

In another embodiment, the resulting metal traces can be optimized in terms of thickness (by choosing the duration of electro-plating) and width (by the mask design) using the principles of metallic strip-line traces to be impedance matched to the typical impedances of the circuits connected. The strip lines can be designed based on knowledge of the dielectric properties of the materials used in the integration process and the impedances of the circuits to be connected. The actual geometry of the metallic traces and its relation to the frequencies of electronic signals being carried by them are taken into consideration when designing the lithographic mask used for the plating of the metal traces. Accordingly, longer traces can be made and more complicated metal interconnect layers can be made, i.e. interconnect layers can be stacked on top of each other. In addition, the power consumption can be reduced when compared to wire bonds as no power is dissipated in the transmission line.

In another aspect of the invention, the method further includes depositing a second electrically conductive layer on the first electrically conductive layer, where a co-axial transmission trace is formed, where signal crosstalk and signal integrity are improved. This can be accomplished by for example, plating only the signal traces in the $1^{st}$ plating step and then covering the chip with another layer of PR to define a metal cover on top of the plated traces.

Figure 3:
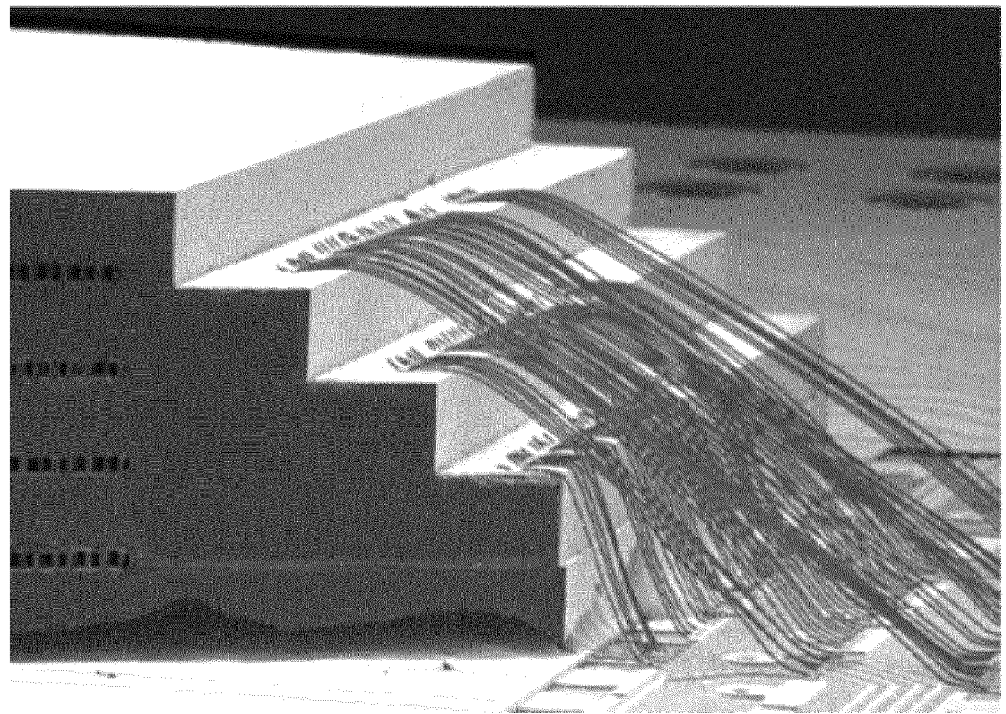
FIG. 3 shows an image of wire bonding between different height dies.
Figure 4:
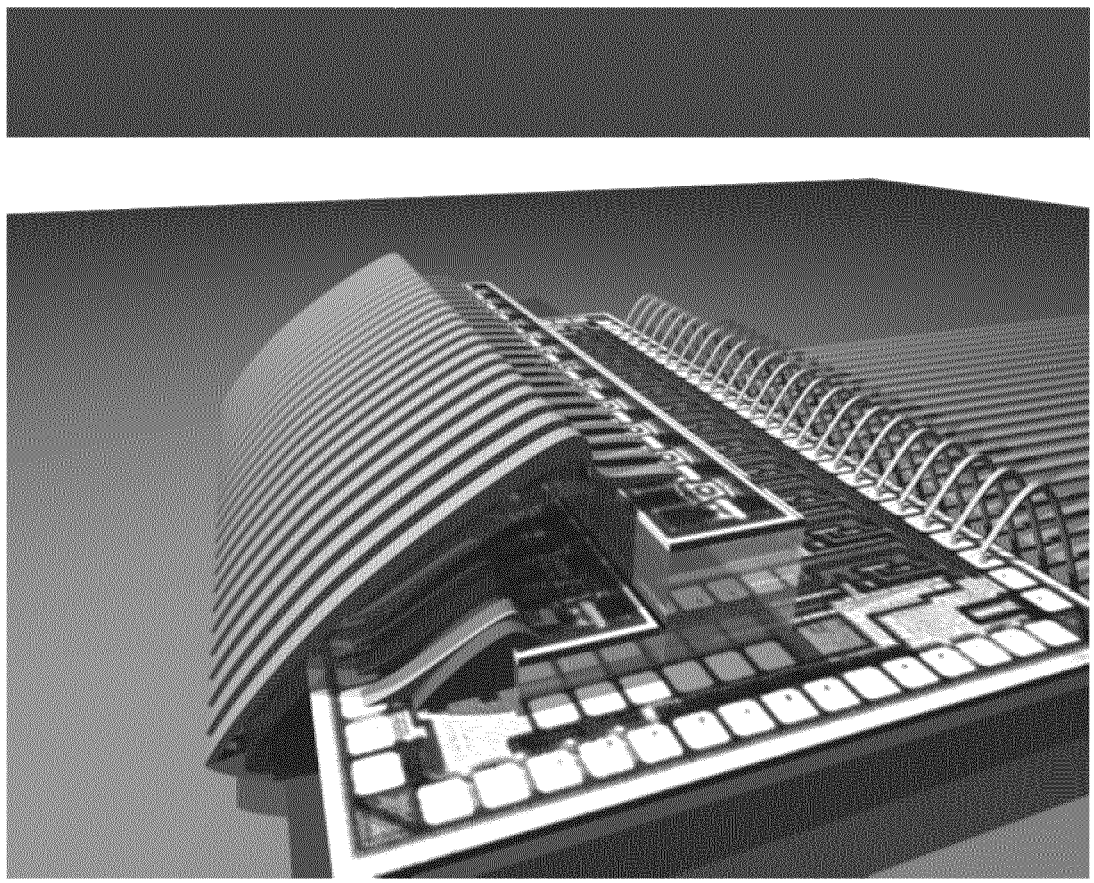
FIG. 4 shows a computer rendering of multiple interconnecting layers, according to one embodiment of the current invention.

In some 3D stacked chips, for example those that rely on intra-chip water cooling, TSV's cannot be used. The technology of choice for interconnect in those cases is to use wire bonds. These thin metal wires, measuring a minimum of 15-20 micrometers in width, are soldered one by one between bond-pads, which need to be designed into the different layers. In case large amounts of wire-bonds are needed, it is quite difficult to have a neatly ordered set of wires. According to one embodiment of the invention, the use of re-flow thick PR layer that is lithographically shaped and controlled in all three-dimensions provides the base for designing multiple interconnecting layers, which can be placed on top of each other without the fear of short circuits or wires breaking up. FIG. 3 shows an image of wire bonding between different height dies, and FIG. 4 shows a computer rendering of multiple interconnecting layers, according to one embodiment of the current invention. According to another aspect of the invention, the conductive traces and the PR bridge span a height up to 250 microns.

According to another embodiment, the invention requires PR to be used, the possible deposition and/or exposure of multiple layers of PR and post processing, including the exposure time, amount, pre and post baking. According to another embodiment, the exact re-flow conditions are needed to obtain the desired slope while not losing any of the resolution.

According to the current invention, one embodiment is based on stacking normal opto-electrical dies directly on the commercial CMOS ICs without grinding opto-electrical dies or drilling holes in the CMOS, and furthermore exploiting a relatively inexpensive solution to connect opto-electrical dies and CMOS drivers on a wafer scale. One embodiment forms a smooth PR bridge between opto-electrical dies and CMOS driver underneath. Then a metallization layer is added on top of the PR bridge by electrical plating.

According to one aspect of the invention, the first die or the second die can be an electro-optical die, CMOS, Bi-CMOS, SiGe, GaAs, InP or Silicon on Insulator. In yet another aspect of the invention, the second die is placed on the first die using a pick and place machine.

According to different embodiments, there are at least two ways to realize a smooth PR slope. One embodiment uses Grayscale lithography, which can be obtained by high-energy beam sensitive glass as optical mask or utilizing projection lithography to introduce diffraction patterns. Another embodiment described in this application is based on the softening character of non-crosslink photoresist. Unexposed photoresist structure changes shape when samples are heated at or above softening point. In general, the first approach is more complex, expensive and time consuming. The second embodiment is practical because the size of the target pattern is relatively big, for example contact pads on opto-electrical dies and drivers can be at least 60 μm.

Turning now to fabrication results, one embodiment provides a smooth PR bridge from the top of the opto-electrical dies to the CMOS surface. In this example, step height is approximately 220 μm. The invention can use relatively thick positive PR, which is highly viscous, and has better coverage ability than relatively thin PR, and has no crosslink.

Figure 5:
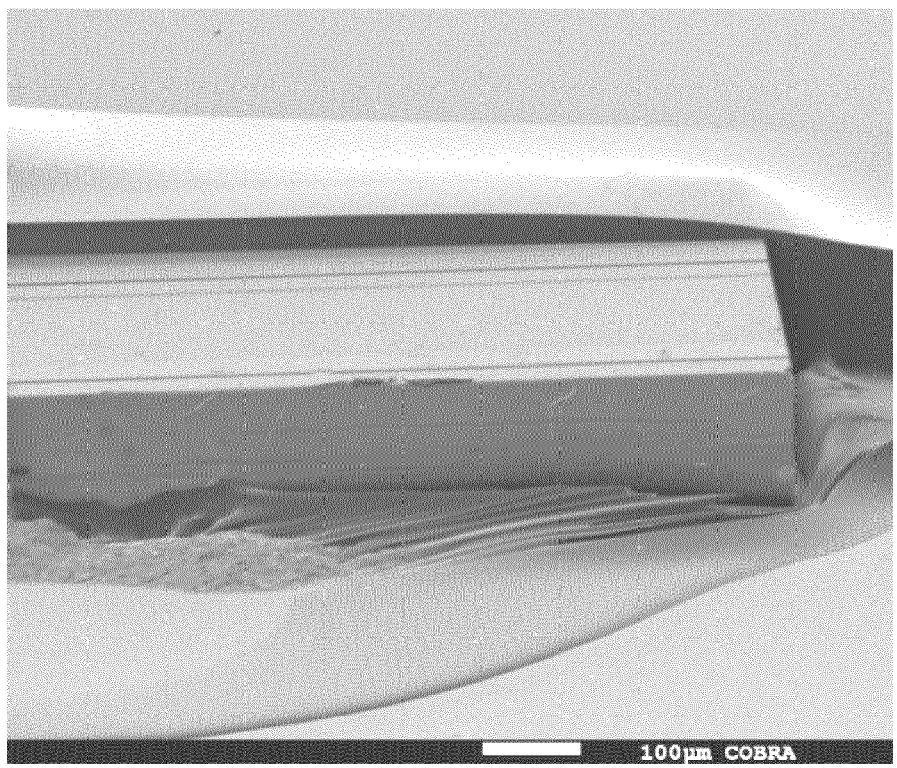
FIG. 5 shows how multilayer coating by high-speed spinning gives very good lithography results, according to one embodiment of the invention.

According to the invention, careful parameter modifications are needed to realize proper edge cover ability. From FIG. 5 and FIG. 8 it can be seen that this multilayer coating strategy gives very good lithography results.

In a further aspect of the invention, the PR compound is applied to the top surface of the first die using the PR spinning process or a spraying process. In one aspect, a thickness of the first layer of the PR compound is controlled using a spinning speed or an acceleration of the spinning process.

Figure 6:
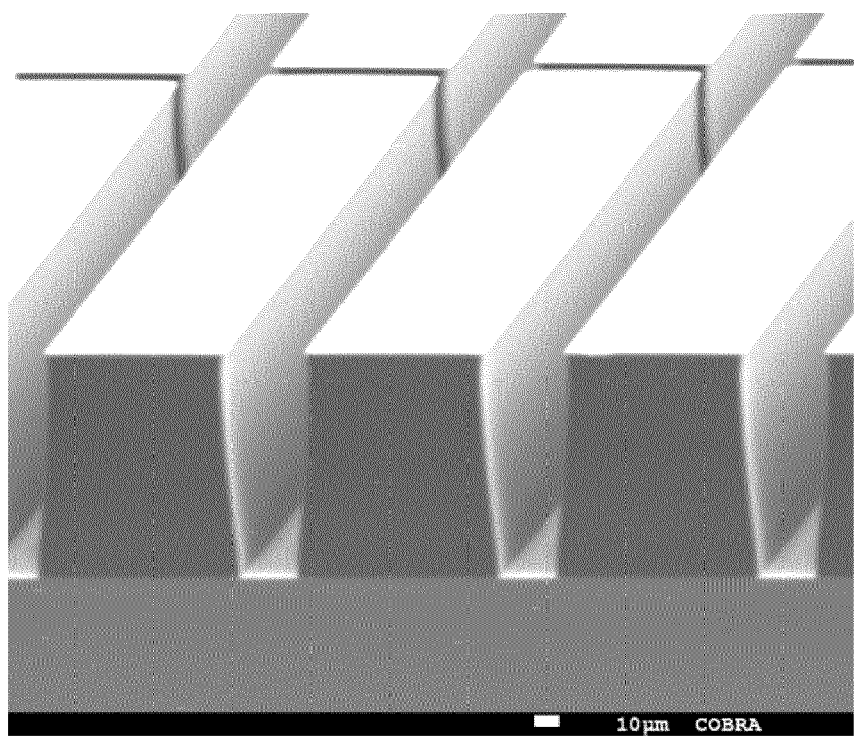
FIG. 6 shows a SEM picture of a clear pattern with the pattern bottom open distance being the same as the mask (i.e. 20 µm), according to one embodiment of the invention.

Within the optimization work carried out in the development of the process detailed in this application the maximum resolution was also tested. A case study of an opto-electrical die with pads gapped 30 μm apart was used to insure that sufficient resolution can be achieved with such ultra-thick PR layers. From the SEM picture in FIG. 6, it is seen that the patterns are clear and the pattern bottom open distance is the same as the mask (i.e. 20 μm).

Figure 7:
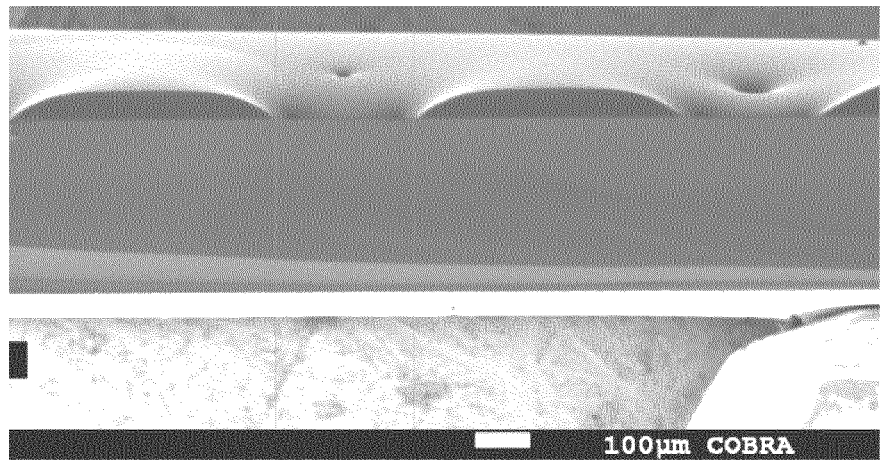
FIG. 7 shows an image of a cross section of a pattern after reflow, according to one embodiment of the invention.

Also established in the process are the right conditions for PR reflow. The reflow process is not only used for the bridge profile, but also enhances the adhesion between the PR and the substrate. To make a smooth slope of the PR sidewall, unexposed patterns on samples are reshaped on the hotplate, which is set to a temperature above softening point of the PR. After reflow, the pattern cross section is shown in FIG. 7. The sidewalls of the PR pattern are very smooth with a typical angle of 30°, which can be ideally covered by metal evaporation or sputtering processes.

Figure 8:
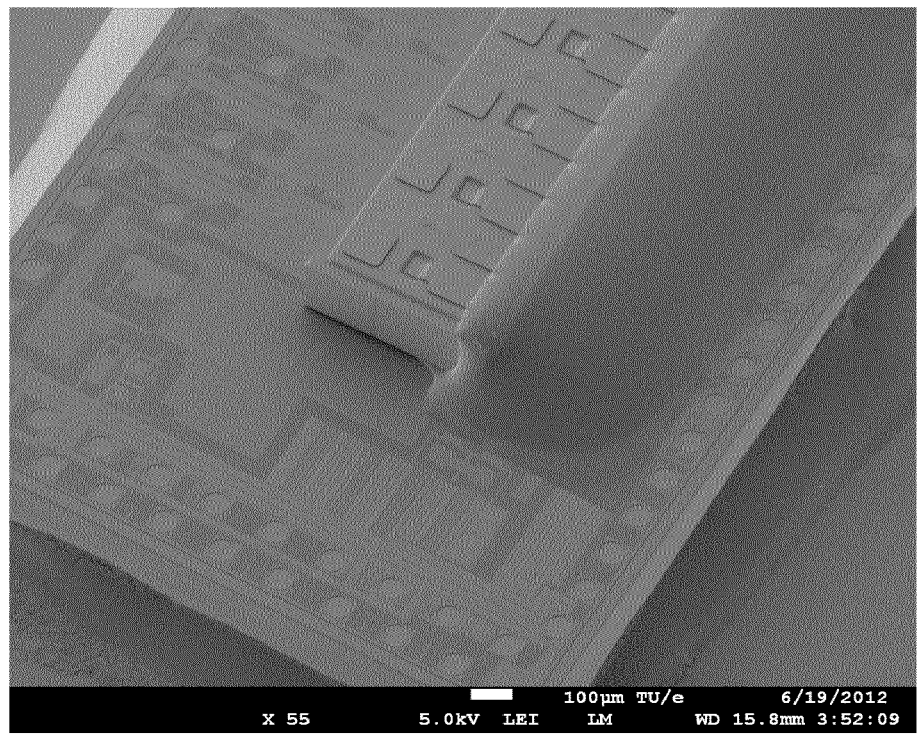
FIG. 8 shows the coverability of the PR for two dies stacked on top of each other, according to one embodiment of the invention.

Also the spinning and processing of multilayer PRs have been developed in the process being patented. This is needed in case multiple dies need to be stacked and lithographically processed at the same time. In FIG. 8 the coverability of the PR is shown for two dies stacked on top of each other (in this case a CMOS chip and an opto-electronic chip). These two chips are soldered to a carrier wafer for process development purposes. In total there are three different heights to the sample and two big steps of >100 um to be covered. Using the same PR, lithography and reflow techniques the patterns on the different topographies are shown in the FIG. 8. Smooth slope PR pattern from the opto-electrical dies (highest surface) to driver (second stage) are formed.

Turning now to optical interconnects, these are a promising solution to overcome fundamental limitations of electrical interconnects with regard to both bandwidth density and bandwidth distance. Low power and compact optical transceiver (transmitter and receiver) form a key building block of an optical interconnect, that may find applications in a variety of systems. Active optical cable modules already have electrical interfaces up to 100 Gbps and find their application in routers and switches, high performance computers and datacenters. Other applications may be in chip-to-chip or board-to-board interconnects, PC-interconnects, digital signage, etc.

A key point for optical interconnect systems is a cost structures in the order of a few cents per Gbps. Closely packaged CMOS IC and Opto-electrical dies might meet this goal, but it is essential to have a packaging technology that allows for automated manufacturing at a wafer scale. Flipchip bonding techniques do not meet this requirement since packaging takes place on a die-by-die basis and still involves the fabrication and preparation of an appropriate carrier for both driver and opto-electronic dies. An example of one embodiment of the invention is provided that includes a compact three-dimensional optical transmitter fabricated with a lithographic metallization scheme that allows for wafer-scale manufacturing. In one embodiment, the fabrication process includes two lithographic steps and uses a single PR material for both gluing a VCSEL array on top of CMOS dies and creating the bridge between bottom and top pads. The advantages of the approach are not only low fabrication costs, as wafer scale fabrication can greatly benefit from the economics of scale, but also impedance matched transmission lines between driver and VCSELs and the potential of a single component interface between the digital electronic world and the analog photonic domain.

The process of 3D stacking includes the placement and gluing of the VCSEL chip on top of the VCSEL driver using PR, the creation of a hard PR bridge between the pads on the VCSEL driver output pads and the VCSEL array input pads, and the plating of the metal traces connecting the pad sets. According to one aspect of the invention, the layer of the PR compound between the dies has a thickness in a range of 2-30 microns.

Figure 9:
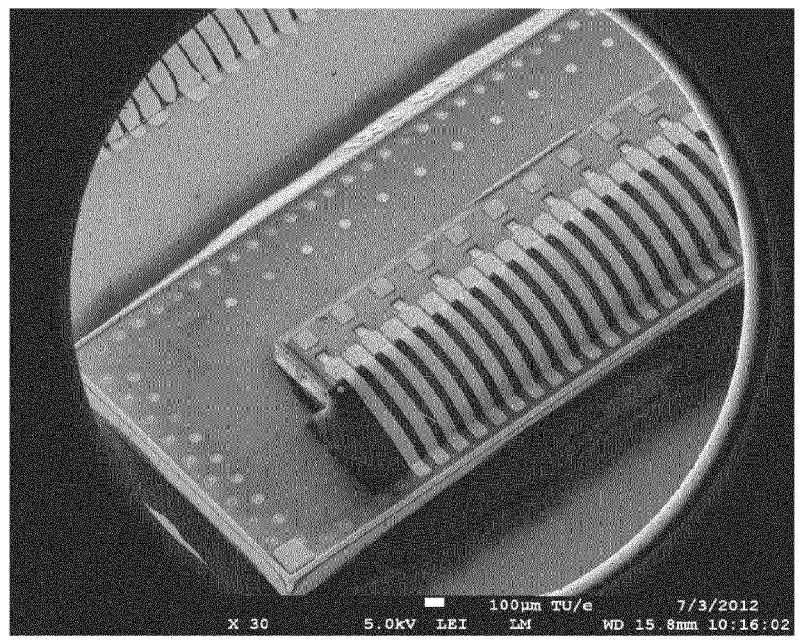
FIG. 9 shows a SEM image of VCSEL based transmitter chip fully assembled, according to one embodiment of the invention.

FIG. 9 shows an SEM image of a fully processed 3D stacked chip. In the current example the same PR is employed for both the gluing of the VCSEL on top of the CMOS IC as well as the creation of the required bridge between the metal pads on the CMOS IC and the VCSEL array. Careful control of the temperature during the spinning and development of the PR insures the formation of the smooth transitions especially critical in the plating stage.

Figure 10:
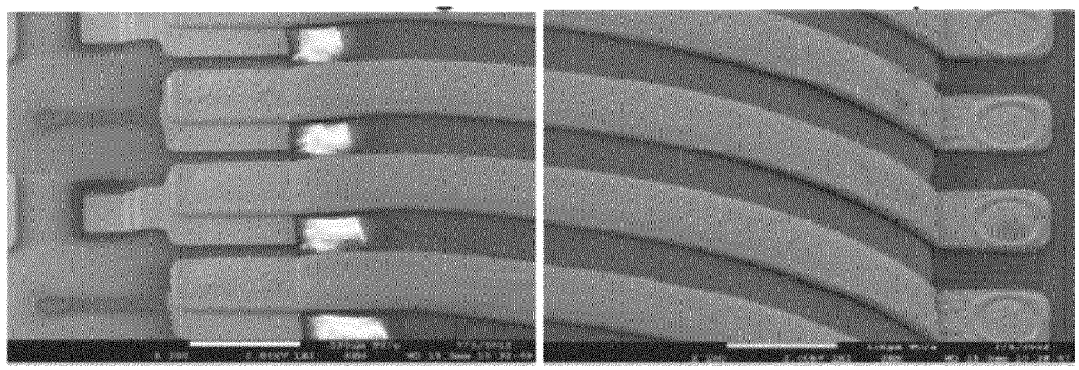
FIG. 10 shows a SEM image of plated metal on VCSEL (Left) and driver (Right) pads, according to one embodiment of the invention.

Shown in FIG. 10 is a side by side image of the quality and coverage of the pads on both top and bottom surfaces of the integrated transmitter chip.

Figure 11:
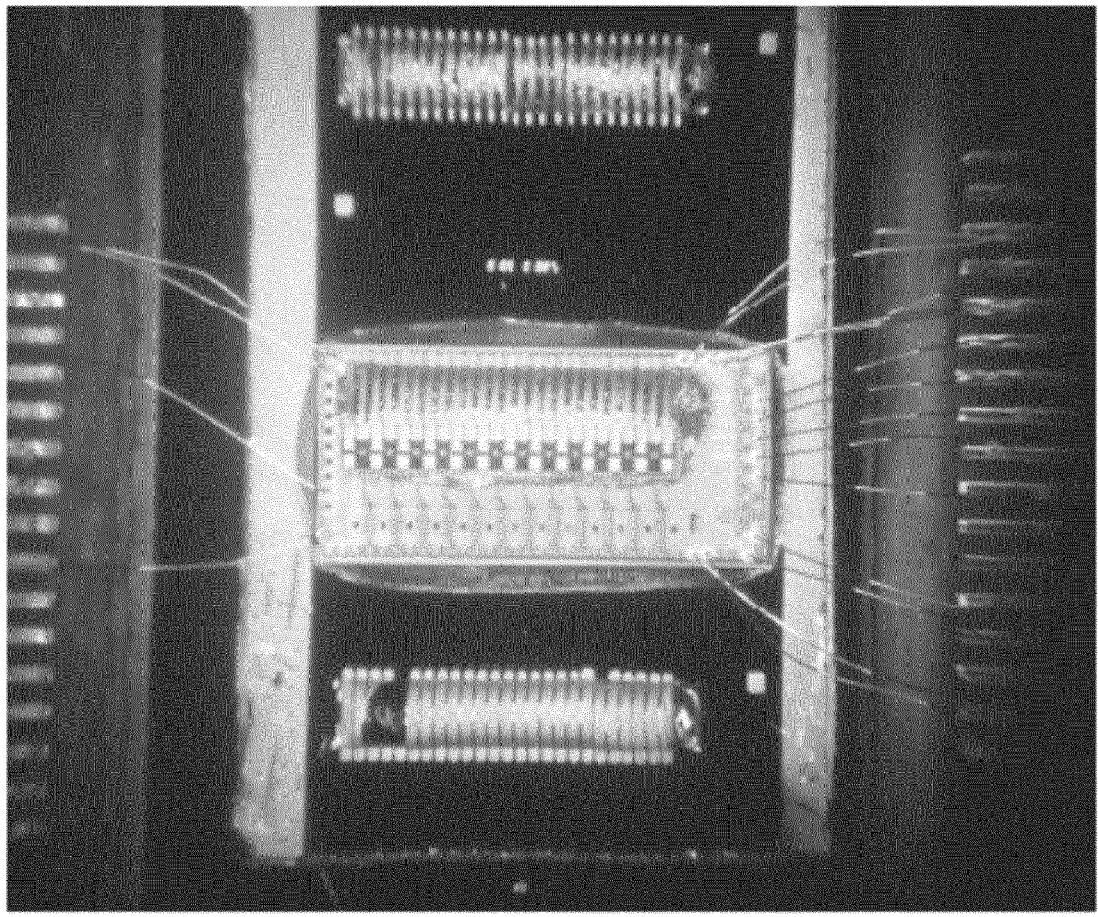
FIG. 11 shows a 12-channel VCSEL array mounted on top of a driver chip and wire bonded to a demo board, according to one embodiment of the invention.

In the current exemplary embodiment the following experimental setup was used. In order to test the performance of the 3D stacked VCSEL array transmitter, it has been wirebonded to a standalone PCB providing easy connectivity to the crucial serial peripheral interface (SPI) communication pins on the CMOS chip and providing power through the DC pads. A microscope image of the mounted chip on a simplified carrier is shown in FIG. 11.

The digital signal for driving the CMOS driver was generated by a 10 Gbps pattern generator using a PRBS of $2^{31}-1$ pattern length and applied using an RF probe to the input pads of the driver IC. The driver includes separate equalization and pre-emphasis options for all 12 channels supported, as well as separate control over the "0" and "1" modulation currents. In the following results table showing the obtained eye patterns the different parameters were tuned to obtain the best possible BER values and the respective eyes were then captured before and after transmission. The light coming out of the VCSELs was collected using a multi mode fiber of different lengths butt coupled to the VCSEL.

Figure 12:
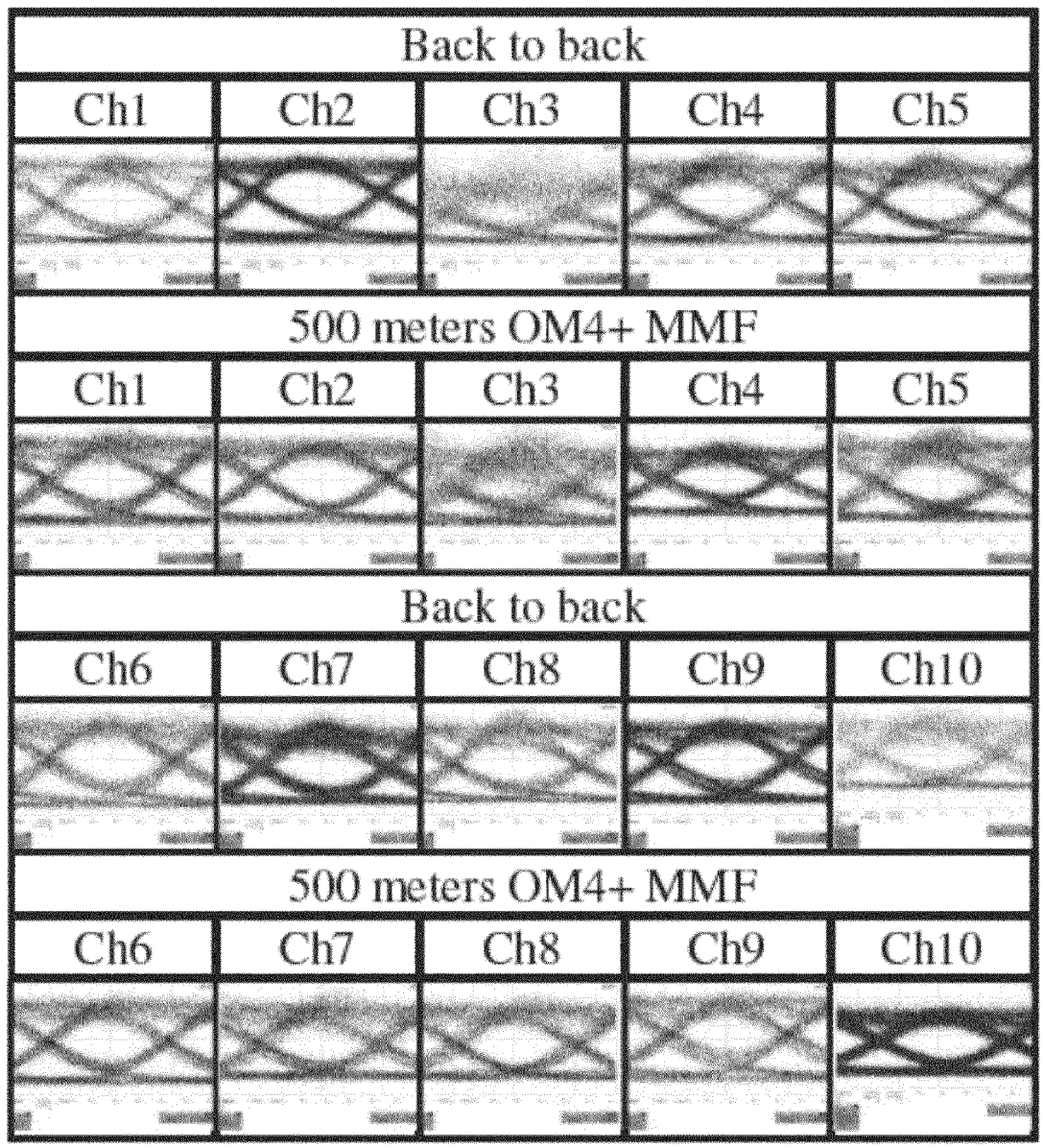
FIG. 12 shows eye patterns for 10 VCSEL light sources with 0 and 500 meters of OM4+ fiber, according to one embodiment of the invention.

FIG. 12 summarizes the measured eye patterns for all 10 VCSELs tested at 10 Gbps. Measured extinction ratio was 4.4 dB or better for almost all channels and was chosen to deliver the best BER performance in terms of receiver sensitivity.

Figure 13A:
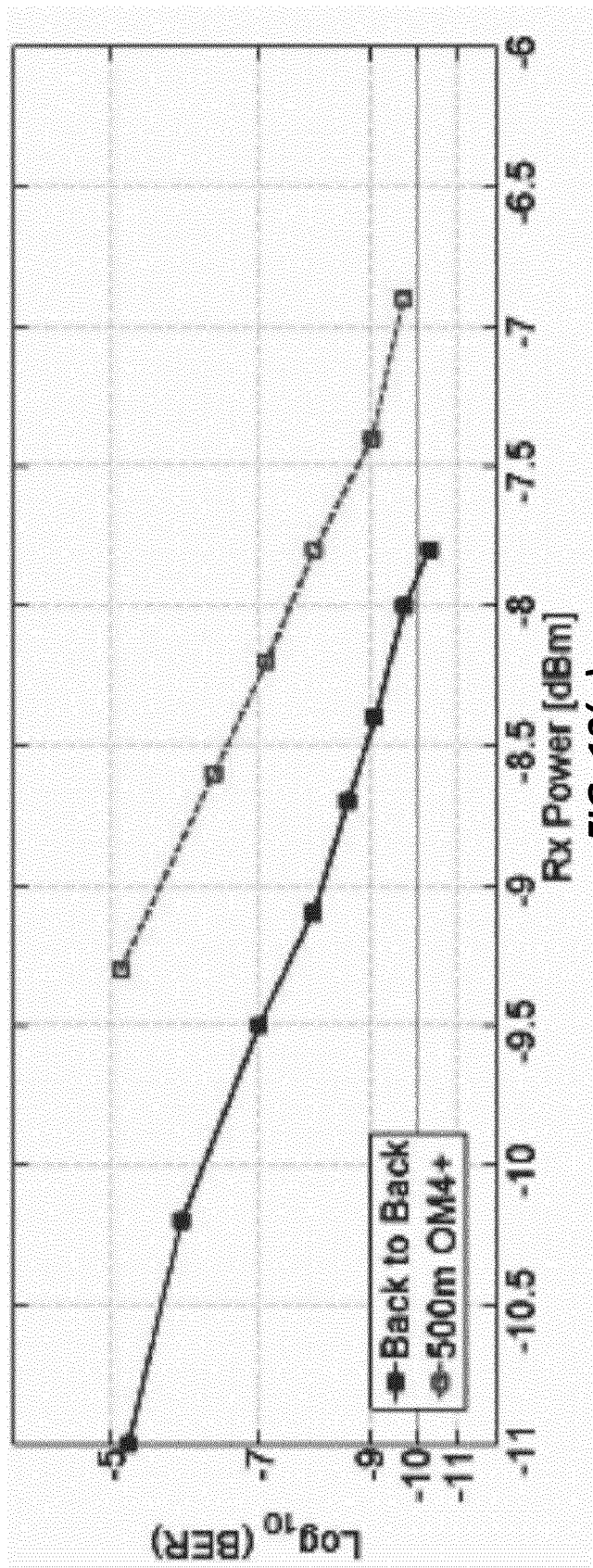
FIGS. 13a-13b show measured BER curve for one channel (top) and error free operation for other channels (bottom), according to one embodiment of the invention.
Figure 13B:
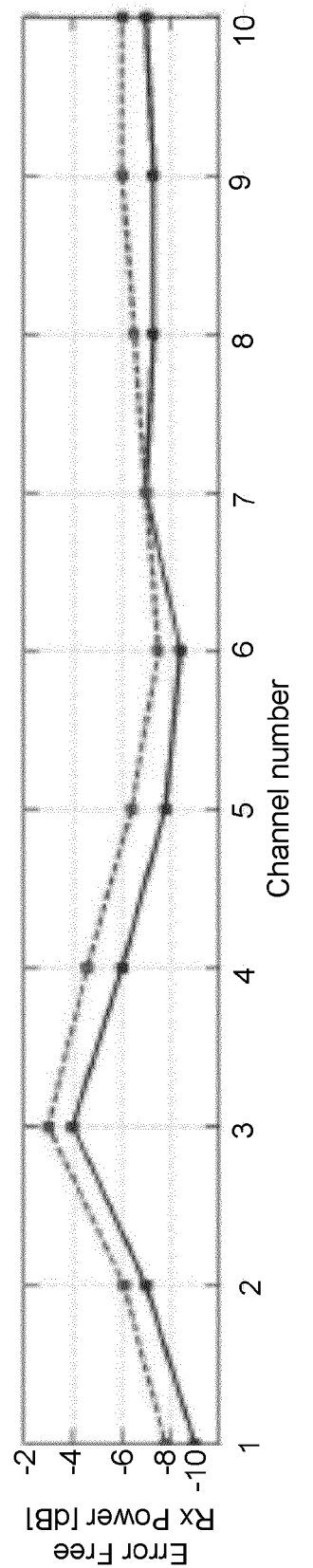

After transmission through the 500 meters of multi mode fiber lower extinction ratio was measured which led eventually to a receiver sensitivity penalty. The measured BER curve for one VCSEL channel as well as the value of error free operation for all other channels showing the respective transmission penalty is given in FIGS. 13a-13b. The obtained value of received power for error free operation varies between −9 to −4 dBm based on the performance of the different VCSEL channels and the limited performance of the PIN photo receiver used.

Figure 14:
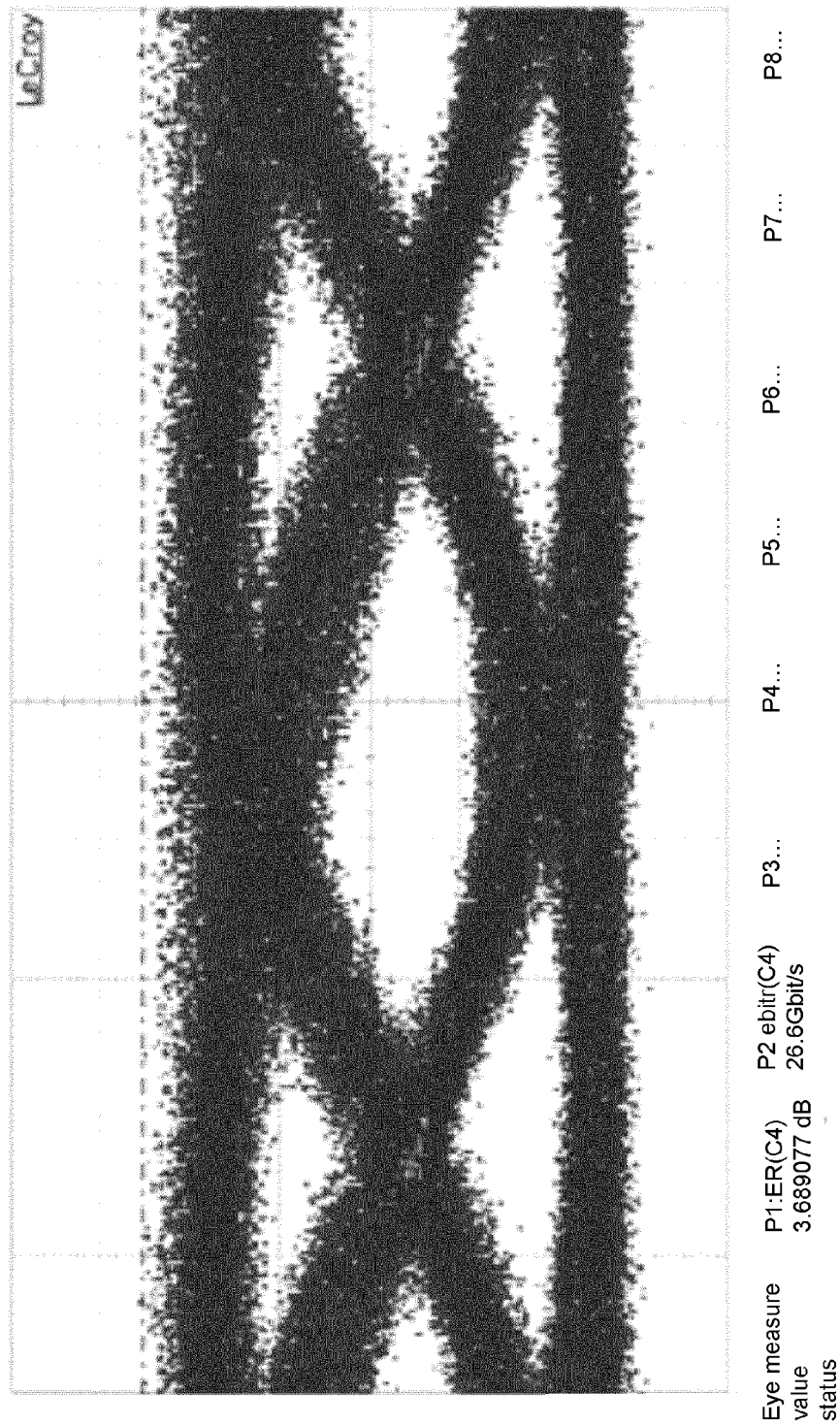
FIG. 14 shows an eye pattern of Channel 2 measured at 12.5 Gbps, according to one embodiment of the invention.

Finally FIG. 14 shows the obtained eye pattern after 500 m transmission through a fiber when driving one of the channels at the maximum supported rate of 12.5 Gbps.

This embodiment of one example of the current invention results in a novel 3D stacked 10×10 Gbps VCSEL based transmitter chip that was fabricated and tested. The 3D stacking integration technique facilitates low cost and scalable fabrication of optical transmitter chips to full wafers. The replacement of wire bonds or flip-chip techniques with plated metal traces offers cost saving but can also greatly enhance future bandwidth density of VCSEL based interconnects as the dominant size constraint of the metal pads can be greatly alleviated (the actual VCSEL size is less than 20% of that total area on this chip).

Open eye patterns with 0 and 500 meters of multi mode fiber transmission were demonstrated with error free operation and only up to 1.4 dB of receiver sensitivity penalty. The IC and VCSEL combination should support operation of up to 12 channels at higher bit-rate.

The single channel operation at 12.5 Gbps is made possible and reduced edge effects in the PR reflow process allows the operation of all 12 VCSELs in the array. The 3D stacked transmitter can reach 150 Gbps throughput or 12×12.5 Gbps and with an area of 7.5 mm$^2$ a bandwidth density figure of merit of 20 Gbps/mm$^2$. The power consumption of the chip is between 30-40 milli-Watts per channel giving energy per bit figure of merit of ~3-4 pJ per bit.

The 3D stacked chip of the current embodiment, which represents a single component converting high-speed digital signals into analog optical signals, opens many opportunities for the inclusion of photonics in electronic boards where traditional high-speed metal traces over PCB are expensive and hard to implement. Such chips are useful when placed in close proximity to bandwidth hungry ICs such as CPU and large port count cross connect switches.

The wafer scale process of the current invention is provided for connecting two quite different surface heights for three-dimension integration technology, according to one embodiment of the invention. The current invention can be widely used as an efficient way to connect any fix path. The significant advantage of the current invention is that the process can be carried out on a wafer scale, making it much easier and cheaper than flip chip process. Since the full-thickness opto-electrical dies are used, reliability and handling issues, which are related with opto-electrical thinning, are alleviated. An example is provided that uses thick PR to form the smooth bridge between two very different height pads.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of interconnecting stacked die surfaces with electrically conductive traces, comprising:
   a. bonding a second die on top of a first die using a first layer of a photoresist compound;
   b. heating said first layer of said photoresist compound above a pyroiyzation point of said photoresist compound, wherein said photoresist compound transitions to a stable layer;
   c. depositing a second layer of said photoresist compound from a top surface of said first die to a top surface of said second die using lithography;
   d. heating said second layer of said photoresist compound layer to a liquid state, wherein said liquid photoresist compound forms a bridge between said top surface of said first die and said top surface of said second die, and
   e. depositing, an electrically conductive layer on said bridge, wherein an electrically conductive trace is formed between said first die top surface and said second die top surface.

2. The method according to claim 1, wherein steps 1a-1e are iteratively repeated.

3. The method according to claim 1, wherein said bridge comprises a smooth convex surface.

4. The method according to claim 1 further comprises depositing a photoresist layer on said electrically conductive layer and depositing a second said electrically conductive layer on said photoresist layer on said electrically conductive layer, wherein a co-axial transmission trace is formed, wherein signal crosstalk and signal integrity are improved.

5. The method according to claim 1, wherein said second layer of said photoresist compound is applied to said top surface of said first die using a photoresist spinning process or a spraying process.

6. The method according to claim 4, wherein a thickness of said first layer of said photoresist compound is controlled using a spinning speed or an acceleration of said spinning process.

7. The method according to claim 1, wherein said second die is placed on said first die using a pick and place machine.

8. The method according to claim 1, wherein said first layer of said photoresist compound has a thickness in a range of 2-30 microns.

9. The method according to claim 1, wherein said first layer of said photoresist bonding said first die and said second is flood exposed with UV light, wherein said second die is a light blocking layer for said first layer of said photoresist compound.

10. The method according to claim 1, wherein said bridge between said first die top surface and said second die bottom surface is heated above a pyrolyzation temperature of said photoresist compound for hardening.

11. The method according to claim 1, wherein said conductive traces and said bridge span a height up to 250 microns.

12. The method according to claim 1, wherein said electrically conductive layer is deposited using deposition selected from the group consisting of sputtering, evaporation, electrical plating and electro-less plating.

13. The method according to claim 1, wherein said electrically conductive layer comprises a material selected from the group consisting of gold, silver, platinum, titanium, aluminum and copper.

14. The method according to claim 1, wherein a thickness of said electrically conductive layer is determined according to a duration of said deposition.

15. The method according to claim 1, wherein a width of said electrically conductive layer is determined according to a mask design.

16. The method according to claim 1, wherein an impedance match between said first die and said second die is determined according to principles of metallic strip-line traces.

17. The method according to claim 1, wherein said deposition of said second layer of said photoresist compound is selected from the group consisting of exposure of multiple said photoresist layers, exposure time, photoresist compound amount, pre baking and post baking.

18. The method according to claim 1, wherein said first die or said second die is selected from the group consisting of an electro-optical die, CMOS, Bi-CMOS, SiGe, GaAs, InP and Silicon on Insulator.

* * * * *